(12) United States Patent
Mu

(10) Patent No.: US 10,115,923 B2
(45) Date of Patent: Oct. 30, 2018

(54) DISPLAY PANEL WITH LUMINESCENT MATERIAL BLOCKS

(71) Applicants: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

(72) Inventor: Junying Mu, Guangdong (CN)

(73) Assignees: SHENZHEN CHINA STAR OPTOELECTRONICS TECHNOLOGY CO., LTD., Shenzhen (CN); WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 328 days.

(21) Appl. No.: 14/891,226

(22) PCT Filed: Sep. 16, 2015

(86) PCT No.: PCT/CN2015/089790
§ 371 (c)(1),
(2) Date: Nov. 13, 2015

(87) PCT Pub. No.: WO2017/041316
PCT Pub. Date: Mar. 16, 2017

(65) Prior Publication Data
US 2017/0256731 A1    Sep. 7, 2017

(30) Foreign Application Priority Data

Sep. 7, 2015    (CN) .......................... 2015 1 0562474

(51) Int. Cl.
*H01L 51/50*        (2006.01)
*H01L 27/32*        (2006.01)
*H01L 51/52*        (2006.01)

(52) U.S. Cl.
CPC ........ *H01L 51/504* (2013.01); *H01L 27/3244* (2013.01); *H01L 51/5016* (2013.01);
(Continued)

(58) Field of Classification Search
CPC .................................................. H01L 27/3211
See application file for complete search history.

(56) References Cited

U.S. PATENT DOCUMENTS

2005/0110398 A1*    5/2005   Lee ...................... H01L 27/3211
                                                               313/504
2010/0090241 A1*    4/2010   D'Andrade et al. ........................
                                                               H01L 27/3211
                                                               257/98
(Continued)

FOREIGN PATENT DOCUMENTS

CN          103824875 A       5/2014
CN          104617231 A       5/2015

*Primary Examiner* — Thao X Le
*Assistant Examiner* — Geoffrey Ida
(74) *Attorney, Agent, or Firm* — Kirton McConkie; Evan R. Witt

(57) ABSTRACT

The present invention discloses a display panel, which includes a display unit. The display unit includes an anode layer, a hole injection layer, a hole transport layer, a luminescent material layer, an electron transporting layer, an electron injection layer, a cathode layer. The luminescent material layer includes the first luminescent material block, the second luminescent material block, and the third luminescent material block. The first luminous material block and the second luminous material block are partially overlapped, and the second luminous material block and the third luminescent material block are partially overlapped. The
(Continued)

present invention is beneficial to producing a pixel having a smaller dimension in the display panel.

20 Claims, 4 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 2251/5376* (2013.01)

(56) References Cited

U.S. PATENT DOCUMENTS

| | | | |
|---|---|---|---|
| 2012/0075278 A1* | 3/2012 | Hara | G09G 3/3208 345/211 |
| 2016/0268351 A1 | 9/2016 | Wu | |
| 2017/0012230 A1 | 1/2017 | Yan | |

\* cited by examiner

DISPLAY PANEL WITH LUMINESCENT MATERIAL BLOCKS

BACKGROUND OF THE INVENTION

Field of the Invention

The present invention relates to a field of display technology, and more particularly to a display panel.

Description of Prior Art

A conventional Organic Light Emitting Diode (OLED) display panel generally includes an anode layer, a cathode layer, a hole injection layer, a hole transport layer, an electron injection layer, an electron transport layer, a luminescent material layer, and the like. In the display panel, different sub-pixels correspond to distinct luminescent materials.

The luminescent material corresponding to each sub-pixel is generally formed through a Fine Metal Mask (FMM) process. However, a dimension of a luminescent material corresponding to a sub-pixel in a display panel cannot become smaller due to a limitation of a minimum aperture dimension of the FMM. This is unfavorable to upgrading the resolution of the display panel.

Therefore, it is necessary to propose a new technical solution to solve the above technical problems.

SUMMARY OF THE INVENTION

The objective of the present invention is to provide a display panel which includes pixels with smaller dimensions to upgrade the resolution of a display panel.

To solve the foregoing problems, a couple of technical solutions are provided as follows.

According to one aspect of the present invention, a display panel comprises at least a display unit, which is divided into a first region, a second region, a third region, a fourth region, and a fifth region, and the display unit comprises an anode layer including a first anode provided in the first region, a second anode provided in the second region, a third anode provided in the third region, a fourth anode provided in the fourth region, and a fifth anode provided in the fifth region. The display unit also comprises a hole injection layer, a hole transport layer, a luminescent material layer. The luminescent material layer includes a first light-emitting section located in the first region and being a portion located in the first region of a first luminescent material block, a second light-emitting section located in the second region and formed by stacking a portion located in the second region of the first luminescent material block and a portion located in the second region of a second luminescent material block, a third light-emitting section located in the third region and being a portion located in the third region of the second luminescent material block, a fourth light-emitting section located in the fourth region and formed by stacking a portion located in the fourth region of the second luminescent material block and a portion located in the fourth region of a third luminescent material block, and a fifth light-emitting section located in the fifth region and being a portion located in the fifth region of the third luminescent material block. The display unit also comprises an electron transporting layer, an electron injection layer, and a cathode layer. The display unit further comprises a switching component, which includes a first switch thin film transistor (TFT) connected to the first anode, a second switch TFT connected to the second anode, a third switch TFT connected to the third anode, a fourth switch TFT connected to the fourth anode, and a fifth switch TFT connected to the fifth anode, in which the first luminescent material block is located in the first region and second region, the second luminescent material is located in the second region, the third region, and the fourth region, as well as the third luminescent material is located in the fourth region and the fifth region.

In the above display panel, the luminescent material layer includes a first layer where the first luminescent material block, the second luminescent material block, and the third luminescent material block are located.

In the above display panel, a first gap exists where the portion of the first luminescent material block is located in the second region and a second gap exists where the portion of the second luminescent material block is located in the second region, in which the first gap and the second gap are arranged to face to each other; a third gap exists where the portion of the second luminescent material block is located in the fourth region and a fourth gap exists where the portion of the third luminescent material block is located in the fourth region, in which the third gap and the fourth gap are arranged to face to each other.

In the above display panel, the luminescent material layer includes a second layer and a third layer, and the first luminescent material block and the third luminescent material block are both located in the second layer while the second luminescent material block is located in the third layer.

In the above display panel, the luminescent material layer includes a fourth layer, a fifth layer, and a sixth layer, and the first luminescent material block is located in the fourth layer, the second luminescent material block is located in the fifth layer, and the third luminescent material block is located in the sixth layer.

In the above display panel, the first luminescent material block, the second luminescent material block, or the third luminescent material block is respectively one among a red luminescent material block, a green luminescent material block, and a blue luminescent material block; and the first luminescent material block, the second luminescent material block, and the third luminescent material block are different from each other.

In the above display panel, the first luminescent material is one of the red luminescent material block and the green luminescent material block, the third luminescent material block is the remaining one of the red luminescent material block and the green luminescent material block, and the second luminescent material block is the blue luminescent material block; the first luminescent material block, the second luminescent material block, and the third luminescent material block are made of a host material and a luminescent material, which is doped onto the host material; and the host materials in the first luminescent material block, the second luminescent material block, and the third luminescent material block are all the same, and the luminescent material in the first luminescent material block and the luminescent material in the third luminescent material block are phosphorescent materials while the luminescent material in the second luminescent material block is a fluorescent material.

According to one aspect of the present invention, a display panel comprises at least a display unit, which is divided into a first region, a second region, a third region, a fourth region, and a fifth region, and the display unit comprises an anode layer including a first anode provided in the first region, a second anode provided in the second region, a third anode provided in the third region, a fourth anode provided in the fourth region, and a fifth anode provided in the fifth region. The display unit also comprises a hole injection layer, a hole transport layer, a luminescent material layer. The luminescent material layer includes a first light-emitting section located in the first region and being a portion located in the first region of a first luminescent material block, a second light-emitting section located in the second region and formed by stacking a portion located in the second region of the first luminescent material block and a portion located in the second region of a second luminescent material block, a third light-emitting section located in the third region and being a portion located in the third region of the second luminescent material block, a fourth light-emitting section located in the fourth region and formed by stacking a portion located in the fourth region of the second luminescent material block and a portion located in the fourth region of a third luminescent material block, and a fifth light-emitting section located in the fifth region and being a portion located in the fifth region of the third luminescent material block. The display unit also comprises an electron transporting layer, an electron injection layer, and a cathode layer.

In the above display panel, the first luminescent material block is located in the first region and second region. The second luminescent material is located in the second region, the third region, and the fourth region, and the third luminescent material is located in the fourth region and the fifth region.

In the above display panel, the luminescent material layer includes a first layer where the first luminescent material block, the second luminescent material block, and the third luminescent material block are all located.

In the above display panel, a first gap exists where the portion of the first luminescent material block is located in the second region and a second gap exists where the portion of the second luminescent material block is located in the second region, in which the first gap and the second gap are arranged to face to each other; a third gap exists where the portion of the second luminescent material block is located in the fourth region and a fourth gap exists where the portion of the third luminescent material block is located in the fourth region, in which the third gap and the fourth gap are arranged to face to each other.

In the above display panel, the luminescent material layer includes a second layer and a third layer, and the first luminescent material block and the third luminescent material block are both located in the second layer while the second luminescent material block is located in the third layer.

In the above display panel, the luminescent material layer includes a fourth layer, a fifth layer, and a sixth layer, and the first luminescent material block is located in the fourth layer, the second luminescent material block is located in the fifth layer, and the third luminescent material block is located in the sixth layer.

In the above display panel, the first luminescent material block, the second luminescent material block, or the third luminescent material block is respectively one among a red luminescent material block, a green luminescent material block, and a blue luminescent material block; and the first luminescent material block, the second luminescent material block, and the third luminescent material block are different from each other.

In the above display panel, the first luminescent material is one of the red luminescent material block and the green luminescent material block, the third luminescent material block is the remaining one of the red luminescent material block and the green luminescent material block, and the second luminescent material block is the blue luminescent material block.

In the above display panel, the first luminescent material block, the second luminescent material block, and the third luminescent material block are made of a host material and a luminescent material, which is doped into the host material; the host materials in the first luminescent material block, the second luminescent material block, and the third luminescent material block are all the same, and the luminescent material in the first luminescent material block and the luminescent material in the third luminescent material block are phosphorescent materials while the luminescent material in the second luminescent material block is a fluorescent material.

In the above display panel, the display unit further comprises a switching component, which includes a first switch thin film transistor (TFT) connected to the first anode, a second switch TFT connected to the second anode, a third switch TFT connected to the third anode, a fourth switch TFT connected to the fourth anode, and a fifth switch TFT connected to the fifth anode.

In the above display panel, the switching component layer is disposed between the base substrate and the anode layer.

In the above display panel, the hole injection layer is disposed between the anode layer and the hole transport layer, the luminescent material layer is disposed between the hole transport layer and the electron transporting layer, and the electron injection layer is disposed between the electron transport layer and the cathode layer.

In the above display panel, the first luminescent material block, the second luminescent material block, and the third luminescent material block are formed by a mask process, and a mask corresponding to the mask process is a fine metal mask.

Compared with the prior art, the present invention allows a display panel which includes pixels with smaller dimensions to upgrade the resolution of the display panel, and the display quality of the display panel is enhanced.

To allow the foregoing summary of the present invention to be more clearly understood, there are preferred embodiments, which proceed with reference to the accompanying drawings, and are described in detail as follows.

DETAILED DESCRIPTION OF THE INVENTION

Regarding the terms used in this specification, "an embodiment" means that the description in connection with the embodiment serves as an example, instance, or illustration of the disclosure. Furthermore, the articles "a" and "an" used in this specification and the appended claims should generally be construed to mean "one or multiple", unless specified or clear from context to be directed to be a singular form. The drawings are drawn schematically and the same reference numbers are used to indicate the same or similar components throughout the drawings.

The display panel of the present invention may be an OLED (Organic Light Emitting Diode) or the like.

Figure 1:
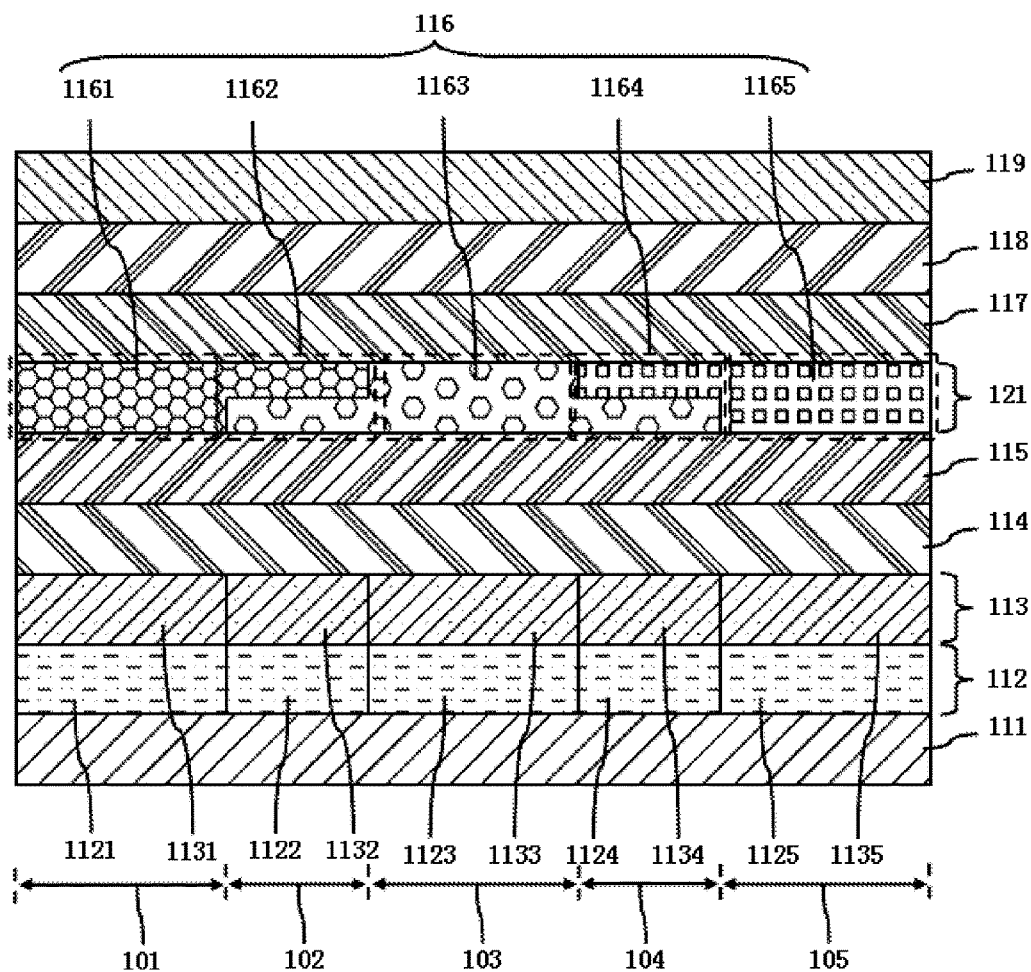
FIG. 1 is a schematic view of a display unit in a display panel according to a first embodiment of the present invention.

Refer to FIG. 1, which is a schematic view of a display unit in a display panel according to a first embodiment of the present invention.

In this embodiment, the display panel includes at least a display unit, the display unit is divided into a first region 101, a second region 102, a third region 103, a fourth region 104, and a fifth region 105, and the first region 101, the second region 102, the third region 103, the fourth region 104, and the fifth region 105 are sequentially arranged.

The display unit comprises a base substrate 111, a switching component layer 112, an anode layer 113, a hole injection layer 114, a hole transport layer 115, a luminescent material layer 116, an electron transporting layer 117, an electron injection layer 118, a cathode layer 119. The switching component layer 112 is disposed between the base substrate 111 and the anode layer 113. The hole injection layer 114 is disposed between the anode layer 113 and the hole transport layer 115. The luminescent material layer 116 is disposed between the hole transport layer 115 and the electron transporting layer 117. The electron injection layer 118 is disposed between the electron transport layer 117 and the cathode layer 119.

The anode layer 113 includes a first anode 1131, a second anode 1132, a third anode 1133, a fourth anode 1134, and a fifth anode 1135. The first anode 1131 is provided in the first region 101, the second anode 1132 is provided in the second region 102, the third anode 1133 is provided in the third region 103, the fourth anode 1134 provided in the fourth region 104, and the fifth anode 1135 is provided in the fifth region 105.

The luminescent material layer 116 includes a first light-emitting section 1161, a second light-emitting section 1162, a third light-emitting section 1163, a fourth light-emitting section 1164, and a fifth light-emitting section 1165. The first light-emitting section 1161 is located in the first region 101, and the first light-emitting section 1161 is a portion located in the first region 101 of a first luminescent material block. The second light-emitting section 1162 is located in the second region 102, and the second light light-emitting section 1162 is formed by stacking a portion located in the second region 102 of the first luminescent material block and a portion located in the second region 102 of a second luminescent material block. The third light-emitting section 1163 is located in the third region 103, and the third light-emitting section 1163 is a portion located in the third region 103 of the second luminescent material block. The fourth light emitting section 1164 is located in the fourth region 104, and the fourth light-emitting section 1164 is formed by stacking a portion located in the fourth region 104 of the second luminescent material block and a portion located in the fourth region 104 of a third luminescent material block. The fifth light-emitting section 1165 is located in the fifth region 105, and the fifth light-emitting section 1161 is a portion located in the fifth region 105 of the third luminescent material block. Namely, the first luminous material block and the second luminous material block are overlapped in the second region 102, and a portion located in the second region 102 of the first luminescent material block and a portion located in the second region 102 of a second luminescent material block constitute the light-emitting section 1162. The second luminous material block and the third luminescent material block are overlapped in the fourth region 104, a portion located in the fourth region 104 of the second luminescent material block and a portion located in the fourth region 104 of a third luminescent material block constitute the fourth light-emitting section 1164.

The switching component layer 112 includes a first switch thin film transistor (TFT) 1121, a second switch TFT 1122, a third switch TFT 1123, a fourth switch TFT 1124, and a fifth switch TFT 1125.

The first switch TFT 1121 is connected to the first anode 1131. The second switch TFT 1122 is connected to the second anode 1132. The third switch TFT 1123 is connected to the third anode 1133. The fourth switch TFT 1124 is connected to the fourth anode 1134. The fifth switch TFT 1125 is connected to the fifth anode 1135.

In this embodiment, the first luminescent material block is located in the first region 101 and second region 102. The second luminescent material is located in the second region 102, the third region 103, and the fourth region 104. The third luminescent material is located in the fourth region 104 and the fifth region 105.

The luminescent material layer 116 includes a first layer 121 where the first luminescent material block, the second luminescent material block, and the third luminescent material block are located.

In the above case, a first gap exists where the portion of the first luminescent material block is located in the second region 102, and a second gap exists where the portion of the second luminescent material block is located in the second region 102. The first gap and the second gap are arranged to face to each other, and they are combined fittingly as the second light-emitting section 1162. A third gap exists where the portion of the second luminescent material block is located in the fourth region 104, and a fourth gap exists where the portion of the third luminescent material block is located in the fourth region 104. The third gap and the fourth gap are arranged to face to each other, and they are combined fittingly as the fourth light-emitting section 1164.

In this embodiment, the first luminescent material block, the second luminescent material block, or the third luminescent material block is respectively one among a red luminescent material block, a green luminescent material block, and a blue luminescent material block. Furthermore, the first luminescent material block, the second luminescent material block, and the third luminescent material block are different from each other.

Preferably, the first luminescent material block is one of the red luminescent material block and the green luminescent material block, and the third luminescent material block is the remaining one of the red luminescent material block and the green luminescent material block. The second luminescent material block is the blue luminescent material block.

In this embodiment, the first luminescent material block, the second luminescent material block, and the third luminescent material block are made of a host material and a luminescent material. The luminescent material is doped into the host material.

The host materials in the first luminescent material block, the second luminescent material block, and the third luminescent material block are all the same, but the luminescent material in the first luminescent material block and the luminescent material in the third luminescent material block are phosphorescent materials while the luminescent material in the second luminescent material block is a fluorescent material.

In this embodiment, the first luminescent material block, the second luminescent material block, and the third luminescent material block are formed by a mask process. A mask corresponding to the mask process is a fine metal mask (FMM).

In this embodiment, the display unit includes a first sub-pixel, a second sub-pixel, a third sub-pixel, a fourth sub-pixel, and a fifth sub-pixel. The first sub-pixel corresponds to the first region 101 in the display unit, and the first sub-pixel comprises the first TFT, the first anode 1131, a part located in the first region 101 of the hole injection layer 114, a part located in the first region 101 of the hole transport layer 115, the first light-emitting section 1161, a part located in the first region 101 of the electron transporting layer 117, a part located in the first region 101 of an electron injection layer 118, and a part located in the first region 101 of the cathode layer 119.

The second sub-pixel corresponds to the second region 102 in the display unit, and the second sub-pixel comprises the second TFT, the second anode 1132, a part located in the second region 102 of the hole injection layer 114, a part located in the second region 102 of the hole transport layer 115, the second light-emitting section 1162, a part located in the second region 102 of the electron transporting layer 117, a part located in the second region 102 of an electron injection layer 118, and a part located in the second region 102 of the cathode layer 119.

The third sub-pixel corresponds to the third region 103 in the display unit, and the third sub-pixel comprises the third TFT, the third anode 1133, a part located in the third region 103 of the hole injection layer 114, a part located in the third region 103 of the hole transport layer 115, the third light-emitting section 1163, a part located in the third region 103 of the electron transporting layer 117, a part located in the third region 103 of an electron injection layer 118, and a part located in the third region 103 of the cathode layer 119.

The fourth sub-pixel corresponds to the fourth region 104 in the display unit, and the fourth sub-pixel comprises the fourth TFT, the fourth anode 1134, a part located in the fourth region 104 of the hole injection layer 114, a part located in the fourth region 104 of the hole transport layer 115, the fourth light-emitting section 1164, a part located in the fourth region 104 of the electron transporting layer 117, a part located in the fourth region 104 of an electron injection layer 118, and a part located in the fourth region 104 of the cathode layer 119.

The fifth sub-pixel corresponds to the fifth region 105 in the display unit, and the fifth sub-pixel comprises the fifth TFT, the fifth anode 1135, a part located in the fifth region 105 of the hole injection layer 114, a part located in the fifth region 105 of the hole transport layer 115, the fifth light-emitting section 1165, a part located in the fifth region 105 of the electron transporting layer 117, a part located in the fifth region 105 of an electron injection layer 118, and a part located in the fifth region 105 of the cathode layer 119.

In the above embodiment, a dimension (area) of any one of the first light-emitting section 1161 and the second light-emitting section 1162 is smaller than a dimension (area) of the first luminescent material block. A dimension (area) of any one of the second light-emitting section 1162, the third light-emitting section 1163, and the fourth light-emitting section 1164 is smaller than a dimension (area) of the second luminescent material block. A dimension (area) of any one of the fourth light-emitting section 1164 and the fifth light-emitting section 1165 is smaller than a dimension (area) of the third luminescent material block. The first luminescent material block, the second luminescent material block, and the third luminescent material block can be made by means of the FMM process. It is assumed that an attainable minimum aperture dimension (area) made use of FMM is S, then a minimum dimension of the first luminescent material block, the second luminescent material block, and the third luminescent material block is S. Accordingly, the dimension of the first light-emitting section 1161, the second light-emitting section 1162, the third light-emitting section 1163, the fourth light-emitting section 1164, and the fifth light-emitting section 1165 are all smaller than S, that is, a dimension of the first sub-pixel, the second sub-pixel, the third sub-pixel, the fourth sub-pixel, and the fifth sub-pixel all can be reached a dimensional status which is smaller than the minimum aperture dimension (area) by the FMM process. The aforementioned technical solution is beneficial to producing a pixel having a smaller dimension so that the resolution of the display panel can be improved. In other words, the aforementioned technical solution is favorable to greatly enhancing the display quality of the display panel.

Furthermore, in the above-mentioned embodiment, a white light can be mixed by controlling emitted lights from the second sub-pixel, e.g. a red and a blue color light (RB), and the fourth sub-pixel, e.g. a green and a blue color light (GB), thereby improving the brightness of the display panel. Consequently, the energy consumption of the display panel can be reduced.

Figure 4:
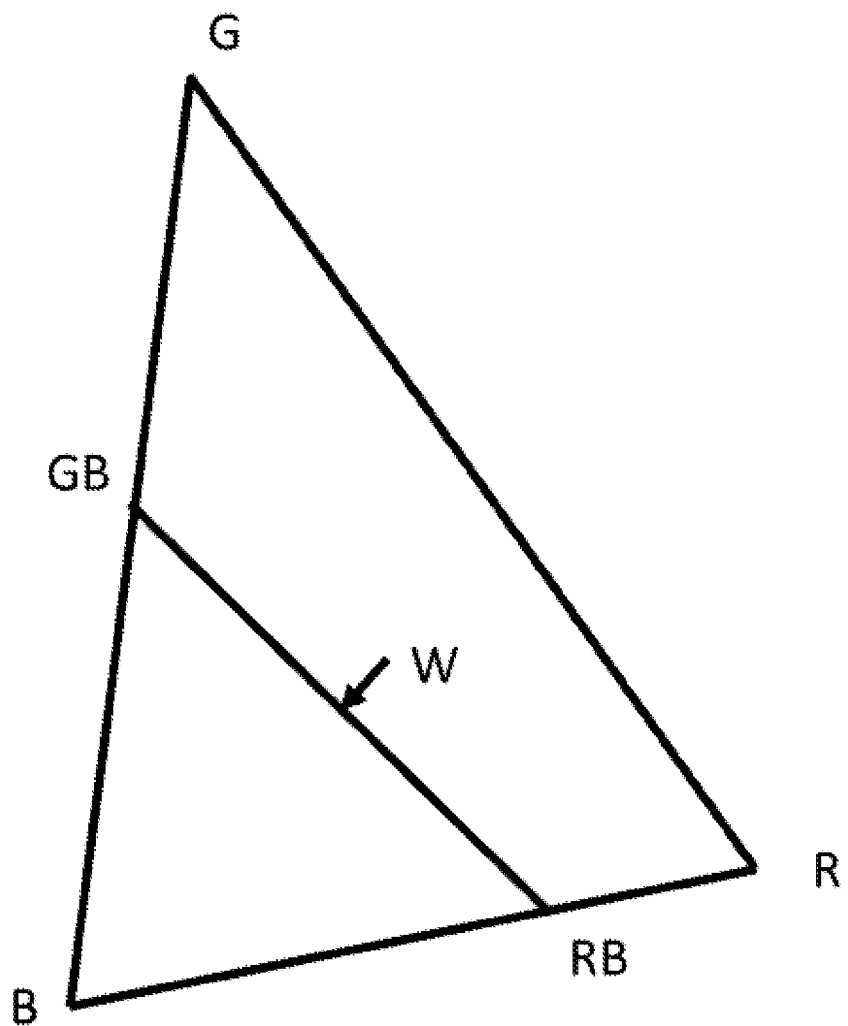
FIG. 4 is a schematic view of color coordinates of each sub-pixel in the display panel of the present invention according to an embodiment of the present invention.

Referring to FIG. 4, a schematic view of color coordinates of each sub-pixel in the display panel is shown according to an embodiment of the present invention. Suppose the first luminescent material block is a red luminescent material block, and the second luminescent material block is a blue luminescent material block, and the third luminescent material block is a green luminescent material block. In FIG. 4, positions of color coordinates of the first sub-pixel R, the third sub-pixel B, and the fifth sub-pixel G are respectively located on three corners of a triangle. A light emitted from the fourth sub-pixel GB is mixed in proportion to lights emitted from the green luminescent material G and the blue luminescent material B. A position of the color coordinate of the fourth sub-pixel is located at a connecting line between the positions of the color coordinate of the fifth sub-pixel G and the color coordinate of the third sub-pixel B. A light emitted from the second sub-pixel RB is mixed in proportion to lights emitted from the red luminescent material R and the blue luminescent material B. A position of the color coordinate of the second sub-pixel is located at a connecting line between the positions of the color coordinate of the first sub-pixel R and the color coordinate of the third sub-pixel B. A connecting line between the positions of the color coordinate of the second sub-pixel RB and the color coordinate of the fourth sub-pixel GB can pass through a region of color coordinate of the white light W. By controlling gray-scale data of the second sub-pixel RB and the fourth sub-pixel GB, a position of the color coordinate of a mixed light which is mixed by the second sub-pixel RB and the fourth sub-pixel GB can be located at a position of the color coordinate of the white light W.

Figure 2:
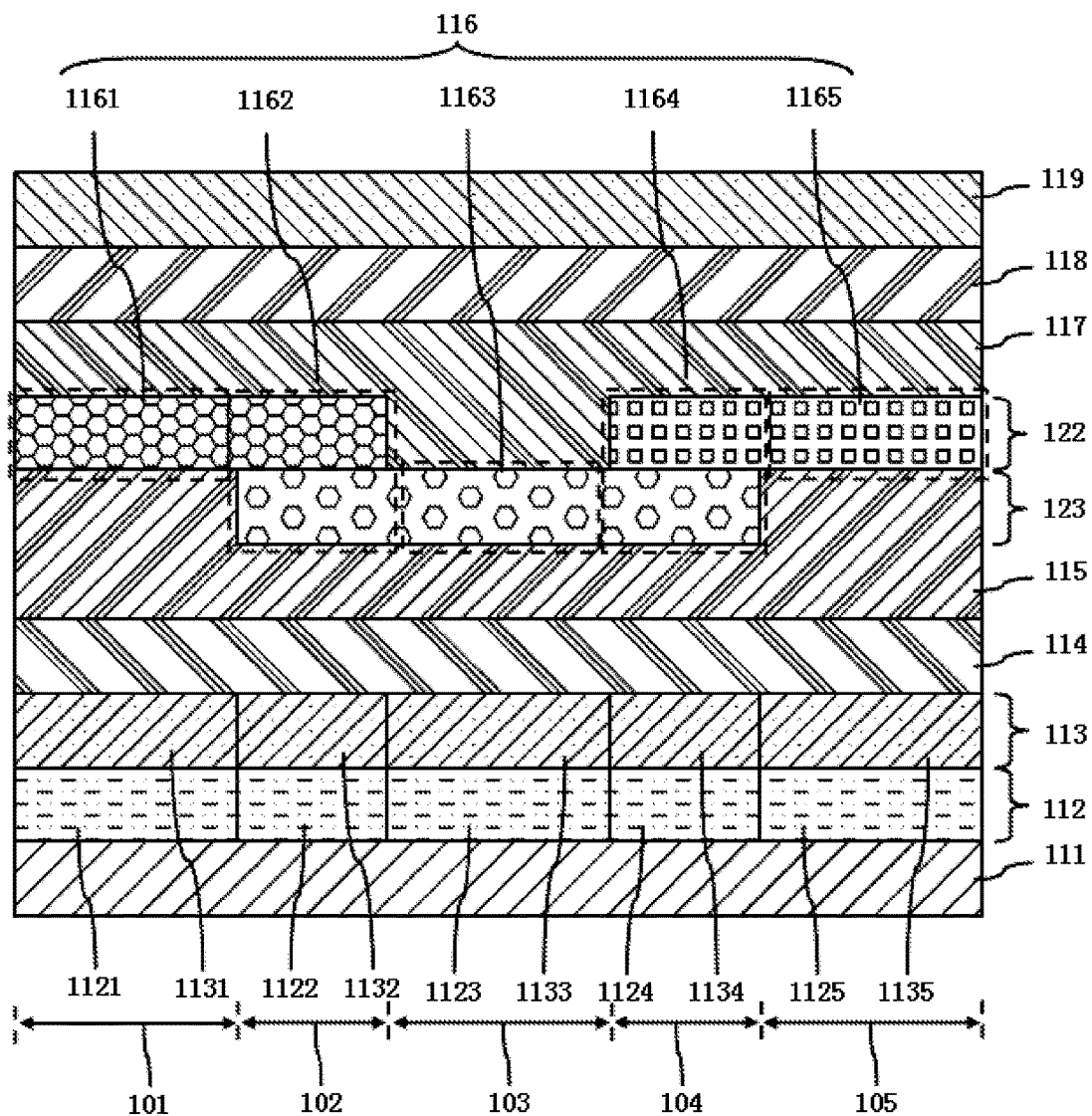
FIG. 2 is a schematic view of a display unit in a display panel according to a second embodiment of the present invention.

Referring to FIG. 2, a schematic view of a display unit in a display panel is shown according to a second embodiment of the present invention. The second embodiment is similar to the first embodiment, and the differences are described as follows.

In the embodiment, the luminescent material layer 116 includes a second layer 122 and a third layer 123, and the first luminescent material block and the third luminescent material block are both located in the second layer 122 while the second luminescent material block is located in the third layer 123.

Figure 3:
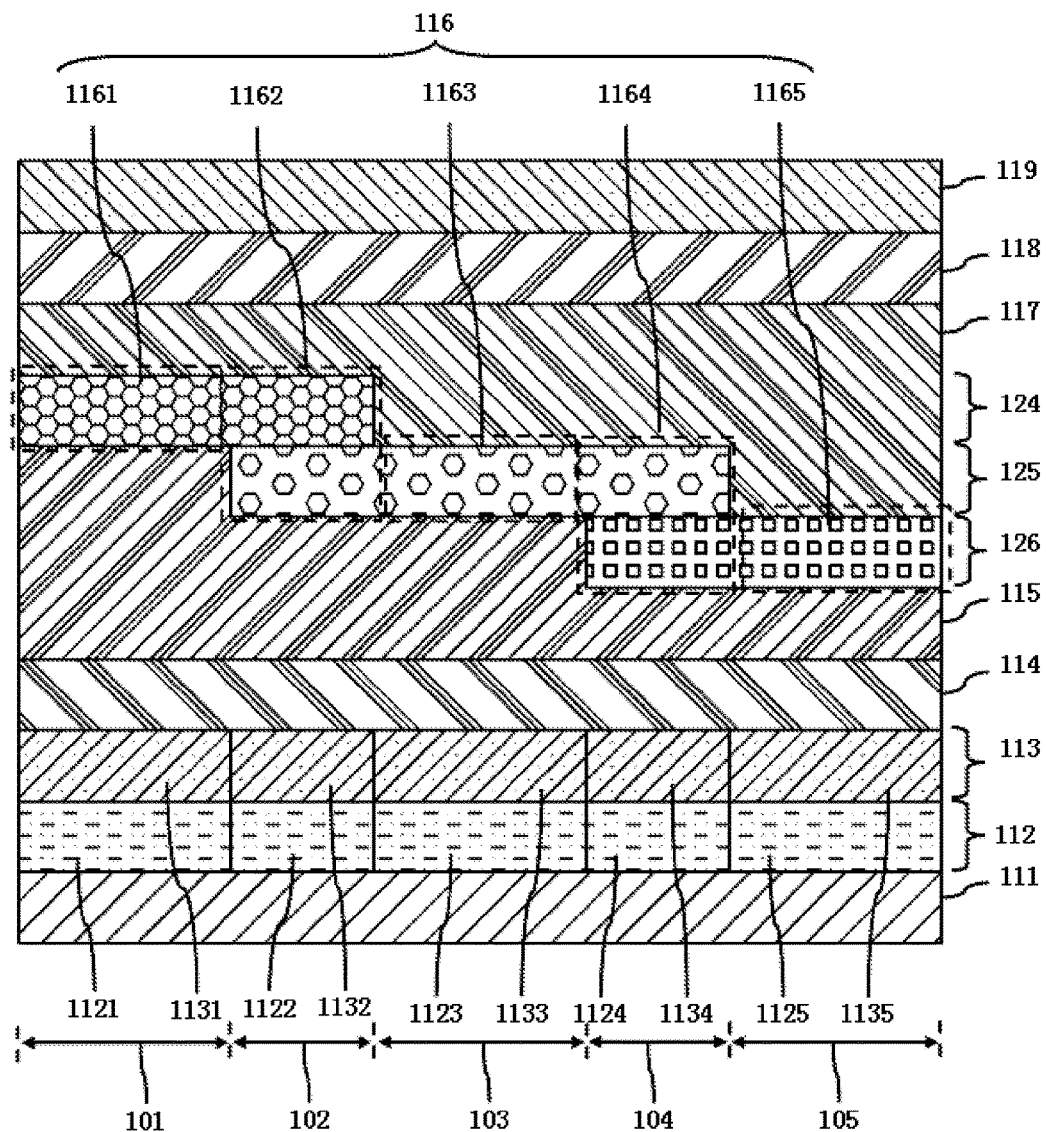
FIG. 3 is a schematic view of a display unit in a display panel according to a third embodiment of the present invention.

Referring to FIG. 3, a schematic view of a display unit in a display panel is shown according to a third embodiment of the present invention. The third embodiment is similar to the first embodiment, and the differences are described as follows.

In the third embodiment, the luminescent material layer 116 includes a fourth layer 124, a fifth layer 125, and a sixth layer 126. The first luminescent material block is located in the fourth layer 124, the second luminescent material block is located in the fifth layer 125, and the third luminescent material block is located in the sixth layer 126.

Despite one or more preferred embodiments of the present invention having been illustrated and described, those having ordinary skills in the art may easily contemplate equivalent changes and modifications according to the disclosure and drawings of the present invention. All such modifications and variations are considered to be encompassed in the scope defined by the claims of the present invention. Particularly with regard to the various functions performed by the above-described components, the terms used to describe such components are intended to perform the specified function corresponding to the component, which may be performed by any other components (functionally equivalent, unless otherwise indicated), even though other components may not be the same in the structure as shown in the exemplary implementations of this specification. Furthermore, although a particular feature relating to a number of embodiments has been disclosed in this specification, this feature may be combined with one or more other features to have other embodiments which are desirable and advantageous to a given or particular application. Moreover, the terms "including", "having", "containing", or variations thereof are used in the detailed description or the claims with a meaning similar to the term "comprising".

In summary, while the present invention has been described with the aforementioned preferred embodiments, it is preferable that the descriptions relating to the above embodiments should be construed as exemplary rather than as limiting of the present invention. One of ordinary skill in the art can make a variety of modifications and variations without departing from the spirit and scope of the present invention as defined by the following claims.

What is claimed is:

1. A display panel comprising:
   at least a display unit, the display unit being divided into a first region, a second region, a third region, a fourth region, and a fifth region, wherein the display unit comprises:
      an anode layer comprising:
         a first anode provided in the first region;
         a second anode provided in the second region;
         a third anode provided in the third region;
         a fourth anode provided in the fourth region; and
         a fifth anode provided in the fifth region;
      a hole injection layer;
      a hole transport layer;
      a luminescent material layer including:
         a first light-emitting section located in the first region, the first light-emitting section being formed solely by a portion located in the first region of a first luminescent material block;
         a second light-emitting section located in the second region, the second light light-emitting section being formed by stacking a portion located in the second region of the first luminescent material block and a portion located in the second region of a second luminescent material block;
         a third light-emitting section located in the third region, the third light-emitting section being a portion located in the third region of the second luminescent material block;
         a fourth light-emitting section located in the fourth region, the fourth light-emitting section being formed by stacking a portion located in the fourth region of the second luminescent material block and a portion located in the fourth region of a third luminescent material block; and
         a fifth light-emitting section located in the fifth region, the fifth light-emitting section being a portion located in the fifth region of the third luminescent material block;
      an electron transporting layer;
      an electron injection layer; and
      a cathode layer;
   the display unit further comprising a switching component, which includes
      a first switch thin film transistor (TFT) connected to the first anode;
      a second switch TFT connected to the second anode;
      a third switch TFT connected to the third anode;
      a fourth switch TFT connected to the fourth anode; and
      a fifth switch TFT connected to the fifth anode;
   wherein the first luminescent material block is located in the first region and second region, the second luminescent material is located in the second region, the third region, and the fourth region, as well as the third luminescent material is located in the fourth region and the fifth region.

2. The display panel according to claim 1, wherein the luminescent material layer includes a first layer where the first luminescent material block, the second luminescent material block, and the third luminescent material block are all located.

3. The display panel according to claim 2, wherein a first gap exists where the portion of the first luminescent material block is located in the second region and a second gap exists where the portion of the second luminescent material block is located in the second region, in which the first gap and the second gap are arranged to face to each other; a third gap exists where the portion of the second luminescent material block is located in the fourth region and a fourth gap exists where the portion of the third luminescent material block is located in the fourth region, in which the third gap and the fourth gap are arranged to face to each other.

4. The display panel according to claim 1, wherein the luminescent material layer includes a second layer and a third layer, and the first luminescent material block and the third luminescent material block are both located in the second layer while the second luminescent material block is located in the third layer.

5. The display panel according to claim 1, wherein the luminescent material layer includes a fourth layer, a fifth layer, and a sixth layer, and the first luminescent material block is located in the fourth layer, the second luminescent material block is located in the fifth layer, and the third luminescent material block is located in the sixth layer.

6. The display panel according to claim 1, wherein the first luminescent material block, the second luminescent material block, or the third luminescent material block is respectively one among a red luminescent material block, a green luminescent material block, and a blue luminescent material block; and the first luminescent material block, the second luminescent material block, and the third luminescent material block are different from each other.

7. The display panel according to claim 6, wherein the first luminescent material is one of the red luminescent material block and the green luminescent material block, the third luminescent material block is the remaining one of the red luminescent material block and the green luminescent material block, and the second luminescent material block is the blue luminescent material block;
   the first luminescent material block, the second luminescent material block, and the third luminescent material block are made of a host material and a luminescent material, which is doped into the host material;
   the host materials in the first luminescent material block, the second luminescent material block, and the third luminescent material block are all the same, and the luminescent material in the first luminescent material block and the luminescent material in the third luminescent material block are phosphorescent materials while the luminescent material in the second luminescent material block is a fluorescent material.

8. A display panel comprising:
   at least a display unit, the display unit being divided into a first region, a second region, a third region, a fourth region, and a fifth region, wherein the display unit comprises:
   an anode layer including:
      a first anode provided in the first region;
      a second anode provided in the second region;
      a third anode provided in the third region;
      a fourth anode provided in the fourth region; and
      a fifth anode provided in the fifth region;
   a hole injection layer;
   a hole transport layer;
   a luminescent material layer including:
      a first light-emitting section located in the first region, the first light-emitting section being formed solely by a portion located in the first region of a first luminescent material block;
      a second light-emitting section located in the second region, the second light light-emitting section being formed by stacking a portion located in the second region of the first luminescent material block and a portion located in the second region of a second luminescent material block;
      a third light-emitting section located in the third region, the third light-emitting section being a portion located in the third region of the second luminescent material block;
      a fourth light-emitting section located in the fourth region, the fourth light-emitting section being formed by stacking a portion located in the fourth region of the second luminescent material block and a portion located in the fourth region of a third luminescent material block; and
      a fifth light-emitting section located in the fifth region, the fifth light-emitting section being a portion located in the fifth region of the third luminescent material block;
   an electron transporting layer;
   an electron injection layer; and
   a cathode layer.

9. The display panel according to claim 8, wherein the first luminescent material block is located in the first region and second region; the second luminescent material is located in the second region, the third region, and the fourth region; and the third luminescent material is located in the fourth region and the fifth region.

10. The display panel according to claim 8, wherein the luminescent material layer includes a first layer where the first luminescent material block, the second luminescent material block, and the third luminescent material block are all located.

11. The display panel according to claim 10, wherein a first gap exists where the portion of the first luminescent material block is located in the second region and a second gap exists where the portion of the second luminescent material block is located in the second region, in which the first gap and the second gap are arranged to face to each other;
    a third gap exists where the portion of the second luminescent material block is located in the fourth region and a fourth gap exists where the portion of the third luminescent material block is located in the fourth region, in which the third gap and the fourth gap are arranged to face to each other.

12. The display panel according to claim 8, wherein the luminescent material layer includes a second layer and a third layer, and the first luminescent material block and the third luminescent material block are both located in the second layer while the second luminescent material block is located in the third layer.

13. The display panel according to claim 8, wherein the luminescent material layer includes a fourth layer, a fifth layer, and a sixth layer, and the first luminescent material block is located in the fourth layer, the second luminescent material block is located in the fifth layer, and the third luminescent material block is located in the sixth layer.

14. The display panel according to claim 8, wherein the first luminescent material block, the second luminescent material block, or the third luminescent material block is respectively one among a red luminescent material block, a green luminescent material block, and a blue luminescent material block; and the first luminescent material block, the second luminescent material block, and the third luminescent material block are different from each other.

15. The display panel according to claim 14, wherein the first luminescent material is one of the red luminescent material block and the green luminescent material block, the third luminescent material block is the remaining one of the red luminescent material block and the green luminescent material block, and the second luminescent material block is the blue luminescent material block.

16. The display panel according to claim 15, wherein the first luminescent material block, the second luminescent material block, and the third luminescent material block are made of a host material and a luminescent material, which is doped onto the host material;
    wherein the host materials in the first luminescent material block, the second luminescent material block, and the third luminescent material block are all the same, and the luminescent material in the first luminescent material block and the luminescent material in the third luminescent material block are phosphorescent materials while the luminescent material in the second luminescent material block is a fluorescent material.

17. The display panel according to claim 8, wherein the display unit further comprises a switching component, which includes a first switch thin film transistor (TFT) connected to the first anode;
a second switch TFT connected to the second anode;
a third switch TFT connected to the third anode;
a fourth switch TFT connected to the fourth anode; and
a fifth switch TFT connected to the fifth anode.

18. The display panel according to claim 17, wherein the switching component layer is disposed between the base substrate and the anode layer.

19. The display panel according to claim 8, wherein the hole injection layer is disposed between the anode layer and the hole transport layer, the luminescent material layer is disposed between the hole transport layer and the electron transporting layer, and the electron injection layer is disposed between the electron transport layer and the cathode layer.

20. The display panel according to claim 8, wherein the first luminescent material block, the second luminescent material block, and the third luminescent material block are formed by a mask process, and a mask corresponding to the mask process is a fine metal mask.

* * * * *